United States Patent [19]

Leaycraft et al.

[11] 4,296,455
[45] Oct. 20, 1981

[54] SLOTTED HEAT SINKS FOR HIGH POWERED AIR COOLED MODULES

[75] Inventors: Edgar C. Leaycraft, Woodstock; Sevgin Oktay, Poughkeepsie; Carl D. Ostergren, Montgomery, all of N.Y.

[73] Assignee: International Business Machines Corporation, Armonk, N.Y.

[21] Appl. No.: 96,942

[22] Filed: Nov. 23, 1979

[51] Int. Cl.³ .............................................. H05K 7/20
[52] U.S. Cl. ................................... 361/383; 361/386; 174/16 HS; 165/80 B; 357/81
[58] Field of Search .............................. 361/380–384, 361/386; 165/122, DIG. 11, 80 B, 80 C; 357/81, 82; 174/16 HS, 15 R, 16 R

[56] References Cited

U.S. PATENT DOCUMENTS

| | | | |
|---|---|---|---|
| 3,193,610 | 7/1965 | Worden, Sr. | 165/80 B |
| 3,843,910 | 10/1974 | Ringuet | 361/384 |
| 4,202,408 | 5/1980 | Temple | 165/DIG. 11 |

OTHER PUBLICATIONS

Variable–Area Heat Sink Device, Connors, IBM Tech. Discl. Bul. vol. 17 No. 4 Sep. 1974 p. 1016.
Thermal Enhancement Technique—, Spaight, IBM Tech. Discl Bull. vol. 20 No. 7 Dec. 1977 p. 2614.
Micro-Modular Air-Cooling Scoop, Simons, IBM Tech. Discl Bull. vol. 22 No. 1 Jun. 1979 p. 240.
Heat Transfer Apparatus for SC Chip, Loeffel, IBM Tech. Discl. Bull. vol. 21, No. 6, Nov. 1978, p. 2430.

*Primary Examiner*—Gerald P. Tolin
*Attorney, Agent, or Firm*—George O. Saile

[57] ABSTRACT

An air cooled high density integrated circuit system wherein heat sink structures are located on one of the surfaces of the modules in the system. The heat sink is composed of a plurality of hollow or flat heat conductive bodies having an opening or openings extending from the module surface toward, but not reaching, the top of the hollow heat sink. Means are provided to direct air flow substantially perpendicular to the upper end of the body. The air flow will be from the top of the heat sink and out of the opening or openings to cool the heat sink and the module. The heat sink structure provides greater surface area and effects the breaking up of the boundary layer near the surface of the module for enhanced cooling.

15 Claims, 6 Drawing Figures

SLOTTED HEAT SINKS FOR HIGH POWERED AIR COOLED MODULES

DESCRIPTION

Technical Field

This invention relates to heat transfer mechanisms, and more particularly, to an improved heat transfer mechanism for removing heat generated from high powered air cooled integrated circuit modules.

Background Art

The dissipation of the heat generated by the circuits in integrated circuit devices may produce serious limitations in microminaturization. This is because the elevated temperatures could cause electrical performance changes and degradation of materials leading to reduced reliability and device failure. The efficient removal of heat from integrated circuit modules for very large integrated circuit devices is a very difficult problem and is a restriction on the design of such integrated circuit modules.

One convenient way of removing heat from an integrated circuit device involves the direct contact to a semiconductor integrated circuit or module containing such integrated circuit of a heat sink structure. Examples of such structures are illustrated in the Technical Disclosure Bulletin "Variable-Area Heat Sink Device" by P. M. Connors, Vol. 17 No. 4, September 1974, page 1016, and "Thermal Enhancement Technique for Large-Scale Integrated Circuit Chip Carriers" by R. N. Spaight Technical Disclosure Bulletin Vol. 20 No. 7, December 1977, page 261. These structures could alternatively have their heat sinks cooled by the natural flow of air or by a purposefully applied cooling air past the heat sinks to reduce their temperature.

U.S. Pat. No. 3,843,910 uses a cooling system which includes an air moving device and air cooled in a heat exchanger under the influence of an external fan which opens into a multiplicity of secondary pipes or circuits, each terminating in a calibrated passage, which allows a predetermined flow rate of fluid to pass. The cooling fluid acts directly upon a component or indirectly upon a group of components by way of a fluid distribution plenum chamber. However, such a system does not necessarily provide a large degree of turbulence in the area of the object to be cooled and, in addition, is relatively complex in a configuration and the use of a heat exchanger for air cooling.

The patent application Ser. No. 043,404, filed May 29, 1979, "Electronic Circuit Module Cooling" and assigned to the assignee of the present patent application describes an integrated circuit cooling system over which the present invention is an improvement. The patent application describes the mounting of a plurality of circuit modules on a large area circuit board assembly. An air plenum chamber is mounted adjacent to the board assembly with a plurality of openings therein over each integrated circuit module in the assembly. A parallel air flow of large volume is directed through the openings therein to impinge directly onto the integrated circuit modules. Each module has a plurality of solid pin-shaped heat sinks attached to its covering member.

Summary of the Present Invention

It is the principal object of the present invention to provide a heat transfer mechanism for a large scale integrated circuit module that will provide for even more efficient heat removal than the system described in the beforementioned patent application.

A more specific object of the invention is to provide a heat transfer mechanism for a high density integrated circuit module which uses impingement cooling of a directed air flow onto the given circuit module that has hollow or flat heat sinks with openings at the module covering surface so as to provide for more surface area and to break up the boundary air layer near the surface of the module covering surface.

The foregoing and other objects and advantages are accomplished by an air cooling system for high density integrated circuit modules which involve the presence of the module containing the integrated circuit chips and having a heat conductive covering surface to which is attached the hollow or flat heat sinks of a particular design. The heat sink is composed of a heat conductive material and having at least one opening therein extending from the surface of the covering body and extending toward the top opening of the hollow heat sinks. Means are provided for impingement air flow substantially perpendicular to the opening in the heat sinks which causes air flow through the hollow sink body and out of the opening in the hollow heat sink.

Disclosure of the Invention

Figure 1:
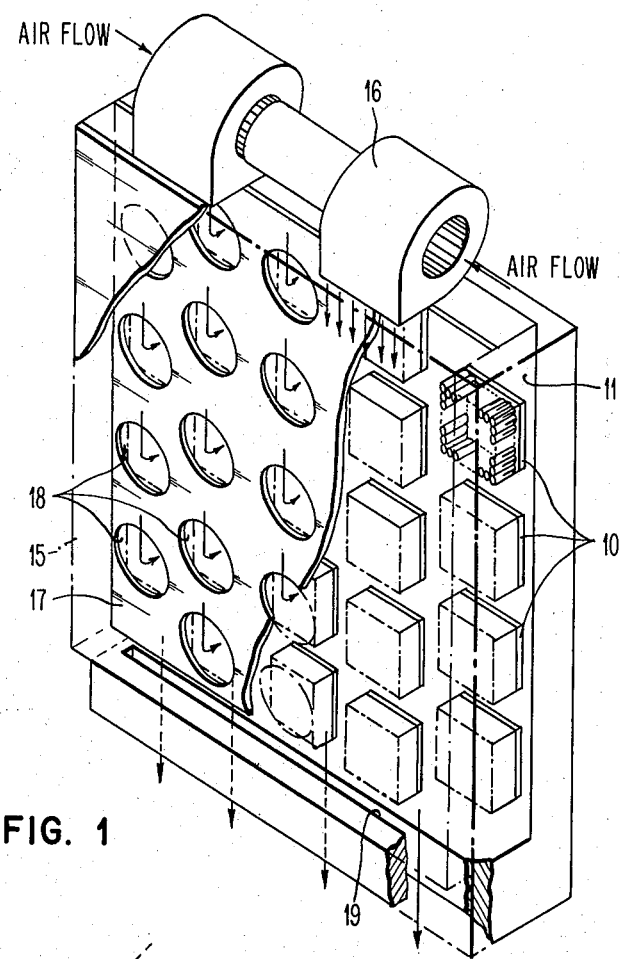
FIG. 1 is a front perspective view, partially in section, of the integrated circuit module system of the present invention.

Referring to FIG. 1, an air cooling system for high density integrated circuit modules is schematically illustrated. Large scale integrated circuit chips (not shown) are packaged in modules 10. The modules are in turn supported by printed circuit board number 11. The modules 10 each have a heat conductive covering surface and attached to this covering surface is a plurality of heat sink devices 12. An air plenum 15 is spaced a suitable distance from the top surface of the integrated circuit module. Associated with the air plenum chamber 15 is an air moving device 16. Internal to the air plenum 15 in the surface 17 facing the integrated circuit board assembly of modules are a plurality of openings 18. Underneath each opening 18 is preferably a module 10 having heat sink means 12 thereon. In the base of the assembly between the air plenum 15 and the circuit board 11 is slit 19 which permits the exhausted air to be exited from the air cooling system.

Figure 2:
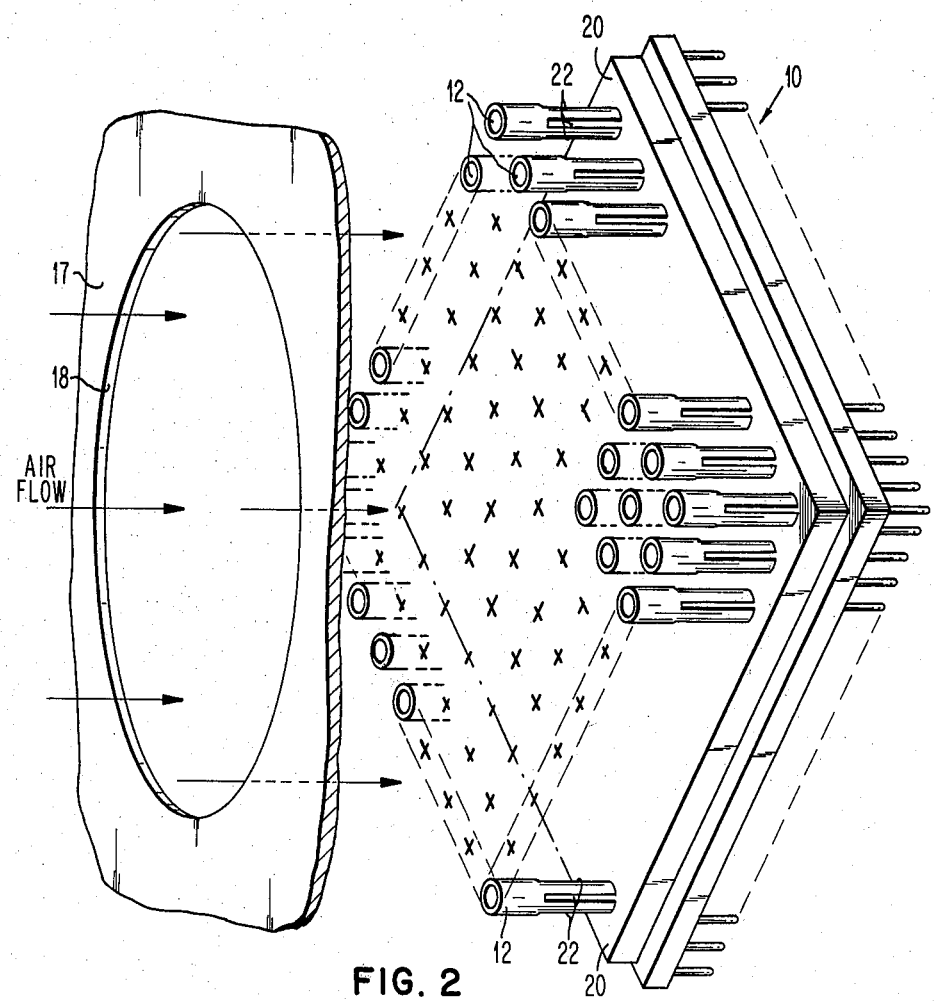
FIG. 2 is a perspective view of a single module containing one form of hollow heat sink of the present invention showing the air flow for cooling of the module.

FIG. 2 is a perspective schematic view of one module in the air cooling system which is illustrative of the theory of operation of the cooling of the integrated circuit module assembly of the present invention. Each of the heat sink members 12 are hollow in this embodiment. They are attached to the heat conductive covering surface 20 of module 10. Attachment is typically by brazing, soldering or other conventional techniques. An opening or openings 22 in the hollow heat sink extend from the surface of the covering body 20 toward the top opening of the hollow heat sink.

Figure 3:
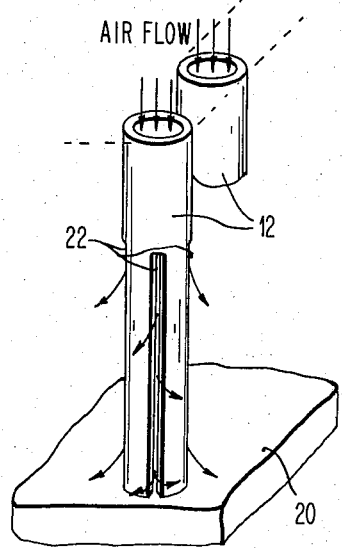
FIG. 3 is a schematic illustration of one type of the impingement cooling of one type of hollow heat sink according to the present invention.

FIG. 3 is an enlargement of one of the hollow heat sink members 12 of FIG. 2. The cooling air is directed by the air moving device 16 into the plenum 15. The openings 18 in the side 17 cause a direct jet air impingement under the pressure of the air in the plenum to be directed onto the hollow heat sinks 12 of the integrated circuit module 10. The air passing through the opening 18 impinges on the hollow heat sinks with portions of the air entering the heat sinks and between the heat sinks. The air which enters the heat sinks will pass through and exit at the opening 22 at the bottom of the heat sink 12. This flow of air at the bottom creates a flow counter to that of the air boundary layer near the surface of the covering surface 20 to thereby break up this air boundary layer. The break up of the air boundary layer due to this turbulence reduces the heat resistance between the module and the cooling medium.

Figure 4:
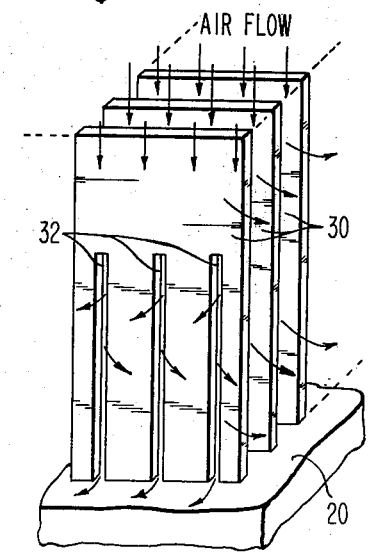
FIG. 4 schematically illustrates the impingement air flow cooling of a straight fin heat sink structure of the present invention.

FIG. 4 illustrates a second embodiment of the present invention wherein a straight fin heat sink 30 is utilized. In this embodiment the heat conductive covering surface 20 of module 10 has attached thereto a straight finned heat sink which is composed of a heat conductive material. The straight finned heat sink contains slits or openings 32 along its length. Air impingement flow is directed from openings 18 as described in the hollow tube initial embodiment of the present invention. The air flow is impinging downward between the straight finned heat sinks 30 and through the slits or openings 32 to cause the turbulence necessary to reduce the air boundary layer to its lowest possible heat resistance characteristics.

Figure 5A:
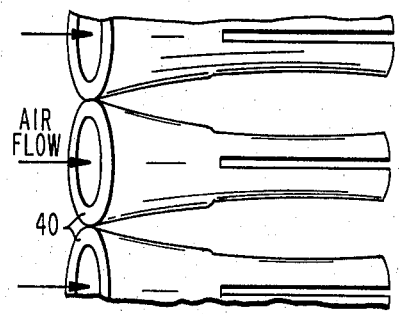
FIGS. 5A and 5B schematically illustrate other hollow heat sink forms according to the present invention.
Figure 5B:
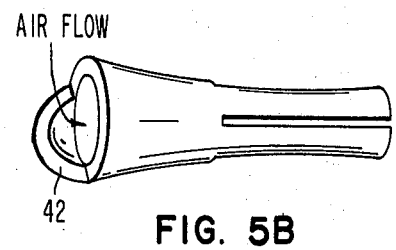

There are other possible configurations for the hollow heat sinks of the present invention. Some of these are shown in FIGS. 5A and 5B. The top 40 of the hollow heat sinks may be flared as shown in FIG. 5A to equal the heat sink spacing to direct more air into the pins. This structure also adds rigidity to the overall heat sink device. For parallel, rather than impingement air flow, flow scoops 42 may be placed on the tops of the hollow heat sinks as shown in FIG. 5B to direct air into the top openings of the heat sinks. The scoop 42 being larger than the heat sink opening will force additional air through the heat sink, accelerating it so that it exits at the bottom at a higher velocity then when entering the top (Venturi effect). This effect can be augmented further by employing inverted and truncated hollow cones with slots on the sidewalls. Aforementioned and other shapes with slots may be further enhanced by fluting the inside walls thus giving rise to air mixing and increased local velocities. It should be realized that conventional augmentations such as fluting, etc. will appreciably improve heat transfer rates only with the presence of slots on sidewalls through increased wash-effect.

It is preferred to have a plurality of slits equidistant along the surface of the heat sink as opposed to a single opening. The slits in both the FIG. 3 and FIG. 4 embodiments are preferred to extend more than one-half way from the covering body toward the top. The total opening area of the openings is between about one-third to one-half of the heat sink area. This ratio is further optimized for a given application as a function of the heat conduction required through the solid parts of the total heat sink. The amount of opening is important in making the inside surfaces of hollow tubes efficient in transferring heat. Similarly in flat fins, the openings provide more efficient heat transfer through the wash-effect.

The following examples are included merely to aid in the understanding of the invention and variations may be made by one skilled in the art without departing from the spirit and scope of the invention.

TABLE I

| Example | Heat Sink | Thermal Resistance in °C./Watts |
| --- | --- | --- |
| 1 | Solid Studs (25mm long) 181 of them on 63.5mm | 0.20 |
| 2 | Slotted Tubes (25mm long) 181 of them on 63mm | 0.18 |
| 3 | Slotted Tubes (25mm long) 61 of them on 63.5mm | 0.22 |
| 4 | Straight Fins (25mm high) 16 of them on 63.5mm | 0.32 |
| 5 | Slotted Straight Fins (25mm high) 16 of them on 63.5mm | 0.26 |

Each heat sink of the type described in each of the Examples in Table I was instrumented with more than 30 thermocouples both on the fin side and on the side of the plate to which the fins were attached. The heat sink was clamped to a wire heater and the assembly was placed in an air column. Air inlet temperature and temperatures at various points on the heat sink were measured. The power inputted to the heat sink was very carefully measured to account for extraneous heat losses. The thermal resistance of each heat sink was then calculated from the measured temperature and power dissipated by the heat sink. The slotted heat sinks of Examples 2, 3 and 5 substantially reduced the thermal resistance and improved the performance of the heat sinks. It should be noted that staggered slots are preferred over in line slots especially in the case of flat fins.

While we have illustrated and described the preferred embodiments of our invention, it is to be understood that we do not limit ourselves to the precise constructions herein disclosed and the right is reserved to all changes and modifications coming within the scope of the invention as defined in the appended Claims.

We claim:
1. An air cooling system for high density integrated circuit modules comprising:
    a module containing integrated circuit chips and having a heat conductive covering surface;
    a plurality of hollow heat sinks, each having a top opening at one end and the opposite end attached to said covering surface and each having a side opening therein extending from said covering surface and extending toward said top opening of each said hollow heat sink; and
    means for impingement air flow substantially parallel to each said hollow heat sink which causes air flow through said top openings of each of said hollow heat sinks and out of said side opening in each said hollow heat sink as well as between said plurality of heat sinks whereby the heat is removed from said hollow heat sinks.
2. The system of claim 1 wherein said side opening is a plurality of slits spaced around each of said heat sinks.

3. The system of claim 2 wherein the said slits extend more than half way from said covering surface to said top opening.

4. The system of claim 2 wherein the opening area of said slits is between about one-third to one-half of the heat sink area.

5. The system of claim 1 wherein the said integrated circuit chips within said module contain logic circuits therein producing about three times the heat energy that can be dissipated without this embodiment of heat sink at the same operating chip temperature.

6. The system of claim 1 wherein the said integrated circuit chips within said module contain memory circuits therein producing about three times the heat energy that can be dissipated without this embodiment of heat sink at the same operating chip temperature.

7. The system of claim 1 wherein said hollow heat sink has a circular cross-section.

8. The system of claim 1 wherein said hollow heat sink is attached to said covering surface by brazing.

9. The system of claim 1 wherein said means for impingement air flow includes an air plenum adapted to receive cooling air at a substantially constant pressure and to direct said cooling air through an opening in said plenum located directly above said module and said heat sink.

10. An air cooling system for high density integrated circuit modules comprising:
a module containing integrated circuit chips and having a heat conductive covering surface;
a plurality of straight fin heat sinks attached to said covering surface and each having slits therein extending from said covering surface toward the top of each said straight fin heat sink; and
means for impingement air flow substantially parallel to said straight fin heat sinks which causes air flow around said heat sinks and through the slits in said heat sinks whereby the heat is removed from said straight fin heat sinks.

11. The system of claim 10 wherein said slits are at least half of the height of the said straight fin heat sink.

12. The system of claim 10 wherein the opening area of said slits is between about one-third to one-half of the heat sink area.

13. The system of claim 10 wherein the said integrated circuit chips within said module contain logic circuits therein producing more than about three times the normal amount of power that can be dissipated without a heat sink at the same operating chip temperature.

14. The system of claim 10 wherein the said integrated circuit chips within said module contain memory circuits therein producing more than about three times the normal amount of power that can be dissipated without a heat sink at the same operating chip temperature.

15. The system of claim 10 wherein said means for impingement air flow includes an air plenum adapted to receive cooling air at substantially constant pressure and to direct said cooling air through an opening in said plenum located directly above said module and said heat sink.

* * * * *